US008878303B2

(12) United States Patent
Hatamian et al.

(10) Patent No.: US 8,878,303 B2
(45) Date of Patent: Nov. 4, 2014

(54) GEOMETRIC REGULARITY IN FIN-BASED MULTI-GATE TRANSISTORS OF A STANDARD CELL LIBRARY

(71) Applicant: Broadcom Corporation, Irvine, CA (US)

(72) Inventors: Mehdi Hatamian, Irvine, CA (US); Paul Penzes, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 58 days.

(21) Appl. No.: 13/734,869

(22) Filed: Jan. 4, 2013

(65) Prior Publication Data
US 2014/0183646 A1    Jul. 3, 2014

Related U.S. Application Data

(60) Provisional application No. 61/747,116, filed on Dec. 28, 2012.

(51) Int. Cl.
*H01L 21/70* (2006.01)
*G06F 17/50* (2006.01)
*H01L 27/092* (2006.01)

(52) U.S. Cl.
CPC ........ *G06F 17/5081* (2013.01); *H01L 27/0924* (2013.01)

USPC ................. 257/369; 257/401; 257/E29.137; 257/E29.275; 716/110; 716/118; 716/119; 716/120; 716/122

(58) Field of Classification Search
None
See application file for complete search history.

(56) References Cited

U.S. PATENT DOCUMENTS

2010/0162184 A1 *    6/2010   Penzes ............................. 716/1

\* cited by examiner

*Primary Examiner* — Yasser A Abdelaziez
(74) *Attorney, Agent, or Firm* — McDermott Will & Emery LLP

(57) ABSTRACT

A method of optimizing a layout of an integrated circuit formed using fin-based cells of a standard cell library is provided. The method includes arranging cell rows of different track heights having standard cells. For each cell row, each of the standard cells includes sub-cell rows with sub-cells of one or more types. The sub-cells are interchangeable with one another to modify a device characteristic of the standard cell. The method also includes evaluating the integrated circuit to determine whether a performance metric of the integrated circuit has been satisfied. The method also includes identifying one or more standard cells to modify a device characteristic of the standard cell for satisfying the performance metric of the integrated circuit. The method further includes modifying the one or more standard cells until the performance metric of the integrated circuit is satisfied.

20 Claims, 13 Drawing Sheets

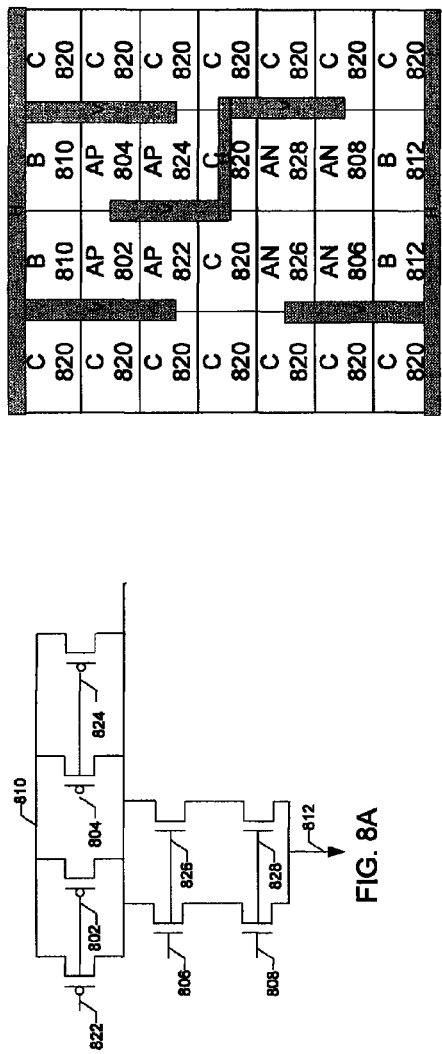
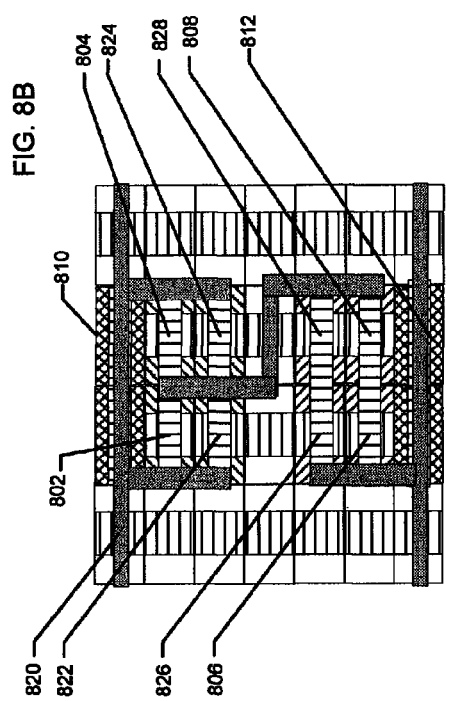
FIG. 8B
FIG. 8C
FIG. 8A

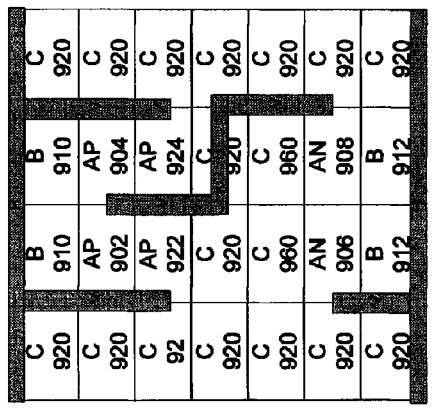
FIG. 9B
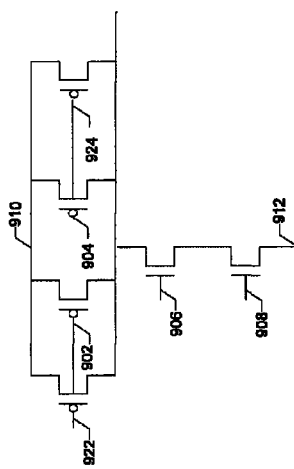
FIG. 9A
FIG. 9C

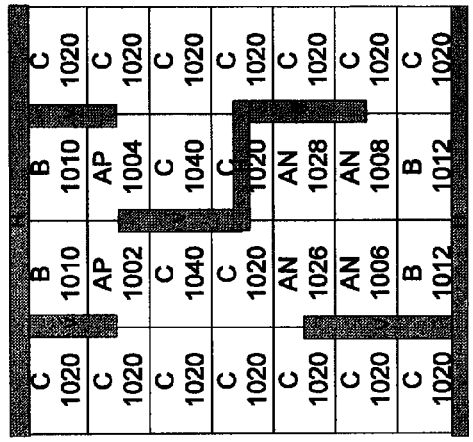
FIG. 10A
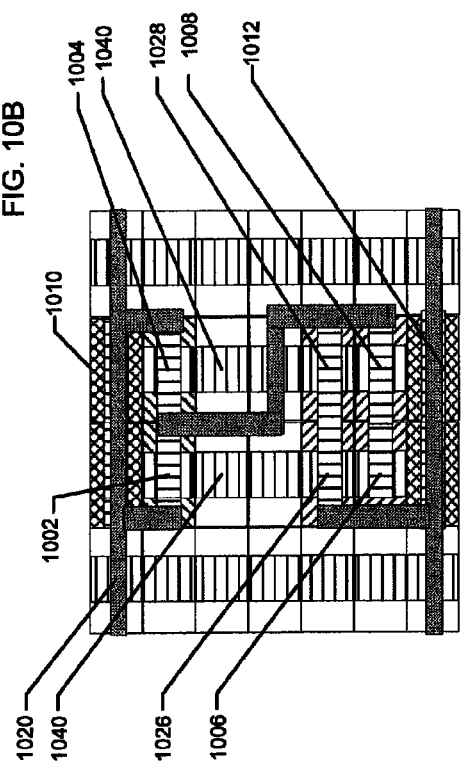
FIG. 10B
FIG. 10C

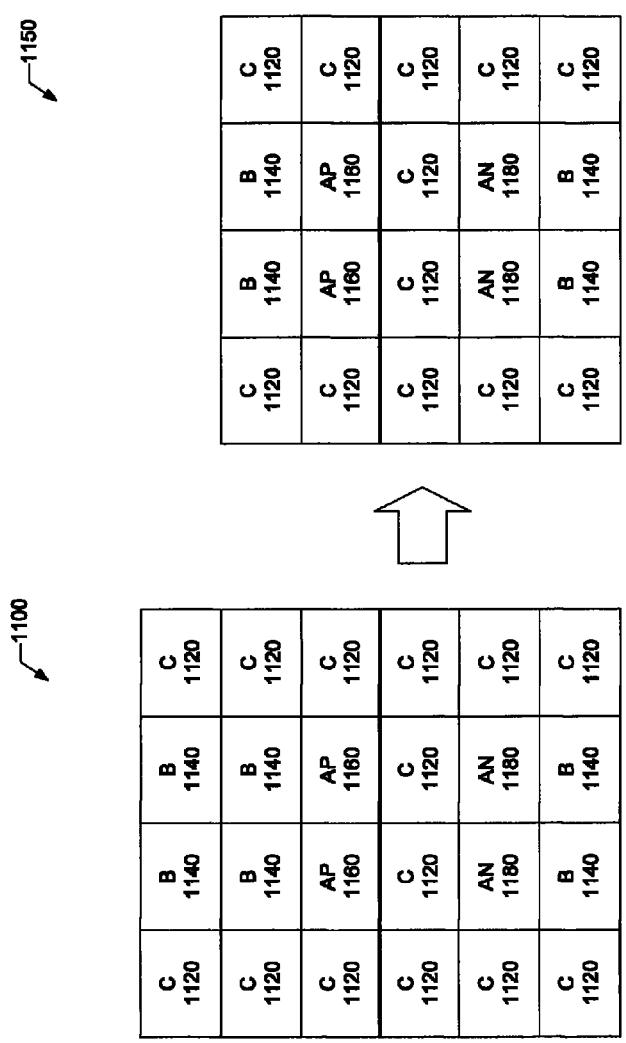

US 8,878,303 B2

GEOMETRIC REGULARITY IN FIN-BASED MULTI-GATE TRANSISTORS OF A STANDARD CELL LIBRARY

CROSS-REFERENCE TO RELATED APPLICATIONS

This application claims the benefit of U.S. Provisional Application No. 61/747,116, entitled "GEOMETRIC REGULARITY IN FIN-BASED MULTI-GATE TRANSISTORS OF A STANDARD CELL LIBRARY," filed Dec. 28, 2012, which is hereby incorporated by reference in its entirety for all purposes.

BACKGROUND

Technology scaling has led to the development of fin-based metal-oxide-semiconductor field-effect transistor (MOSFET) structures as an alternative to the bulk-Silicon (or bulk-Si) MOSFET structure for improved scalability. The fin-based MOSFET utilizes a silicon fin to wrap the conducting channel, which forms the body of the transistor. In effect, the gate electrode of the transistor straddles or surrounds the fin. During operation, current flows between the source and drain electrodes of the transistor along the gated sidewall surfaces of the fin.

With the introduction of the fin-based process, fixed distance restrictions are imposed on the available transistor sizes. In particular, the width of the transistor is limited to multiples of a fin pitch. That is, the transistor sizing is dependent upon the number of fins that forms the transistor. This restriction reduces the flexibility of circuit designs.

SUMMARY

A circuit and/or method is provided for geometric regularity in fin-based multi-gate transistors of a standard cell library, substantially as illustrated by and/or described in connection with at least one of the figures, as set forth more completely in the claims.

BRIEF DESCRIPTION OF THE DRAWINGS

Certain features of the subject disclosure are set forth in the appended claims. However, for purpose of explanation, several implementations of the subject disclosure are set forth in the following figures.

FIGS. 8A-8C illustrate the circuit topology with a second transistor drive in accordance with one or more implementations.

FIGS. 9A-9C illustrate the circuit topology with a first transistor ratio in accordance with one or more implementations.

FIG. 10A-10C illustrate the circuit topology with a second transistor ratio in accordance with one or more implementations.

FIG. 11 illustrates a side-by-side comparison of conceptual floorplans before and after optimization in accordance with one or more implementations.

DETAILED DESCRIPTION

It is understood that other configurations of the subject disclosure will become readily apparent to those skilled in the art from the following detailed description, wherein various configurations of the subject disclosure are shown and described by way of illustration. As will be realized, the subject disclosure is capable of other and different configurations and its several details are capable of modification in various other respects, all without departing from the scope of the subject disclosure. Accordingly, the drawings and detailed description are to be regarded as illustrative in nature and not as restrictive.

The subject technology addresses the aforementioned design limitations of a fin-based design process by proposing a standard cell composed of sub-cells of geometric regularity as building blocks to implement a standard cell library. The sub-cells allow the standard cell to change device characteristics on-the-fly by having the sub-cells configured to be interchangeable with one another depending on the speed/leakage requirements of the standard cell. This interchangeability of sub-cells within a standard cell increases the flexibility of the standard cell to adjust its performance, power and/or area characteristics without the need to change standard cells and/or standard cell libraries.

According to some implementations, a method of optimizing a layout of an integrated circuit formed using fin-based cells of a standard cell library is provided. The method includes arranging cell rows of different track heights having standard cells. For each cell row, each of the standard cells includes sub-cell rows with sub-cells of one or more types. The sub-cells are interchangeable with one another to modify a device characteristic of the standard cell. The method also includes evaluating the integrated circuit to determine whether a performance metric of the integrated circuit has been satisfied. The method also includes identifying one or more standard cells to modify a device characteristic of the standard cell for satisfying the performance metric of the integrated circuit. The method further includes modifying the one or more standard cells until the performance metric of the integrated circuit is satisfied.

Figure 1:
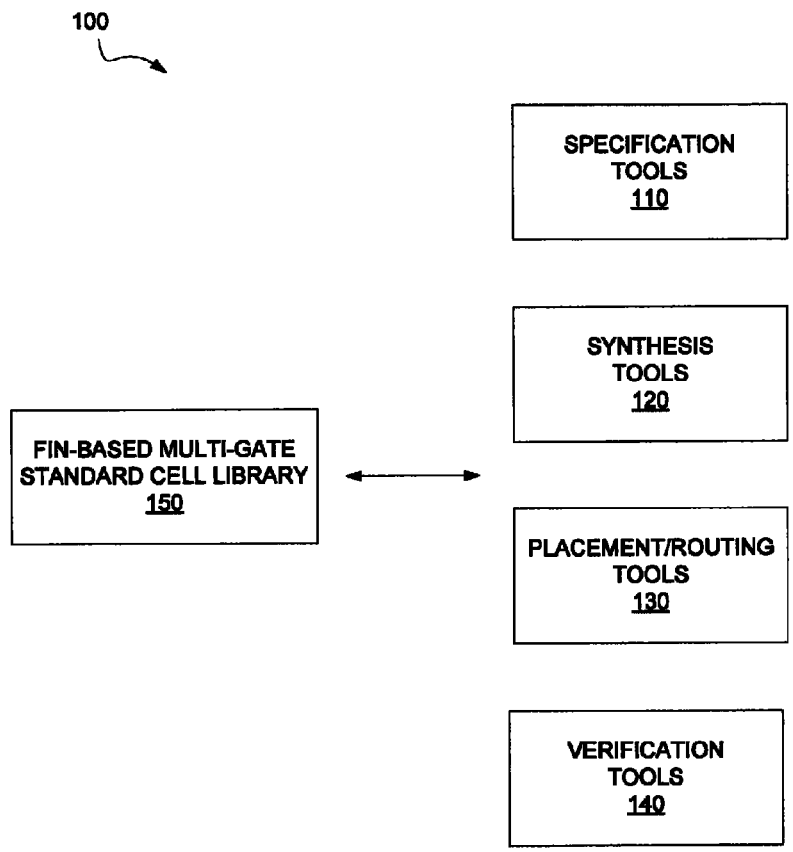
FIG. 1 illustrates a high-level environment used in the design of integrated circuits in accordance with one or more implementations.

FIG. 1 illustrates a design environment 100 used in the design of integrated circuits in accordance with one or more implementations. The design environment 100 includes specification tools 110, synthesis tools 120, placement/routing tools 130, and verification tools 140. During the design process, the functionality of the chip is specified in a specification tool 110 using a standard hardware programming language such as Verilog. The resulting circuit description is synthesized/mapped into the basic gates of a fin-based multi-gate standard cell library 150, using one or more synthesis tools 120. The resulting gate netlist is then placed and routed using placement/routing tools 130. Finally, the connectivity and functionality of the integrated circuit are verified using a verification tool 140.

While each of these components is important for the final quality of the resulting integrated circuit, the quality of implementation achievable by most of these components is design dependent. For example, a good Verilog code specifying circuit A, does not make an independent circuit B any better. However, an adequate standard cell library makes all designs better. The quality of the standard cell library influences all designs and as such has a far reaching influence on the quality of the resulting integrated circuit chip.

Figure 2:
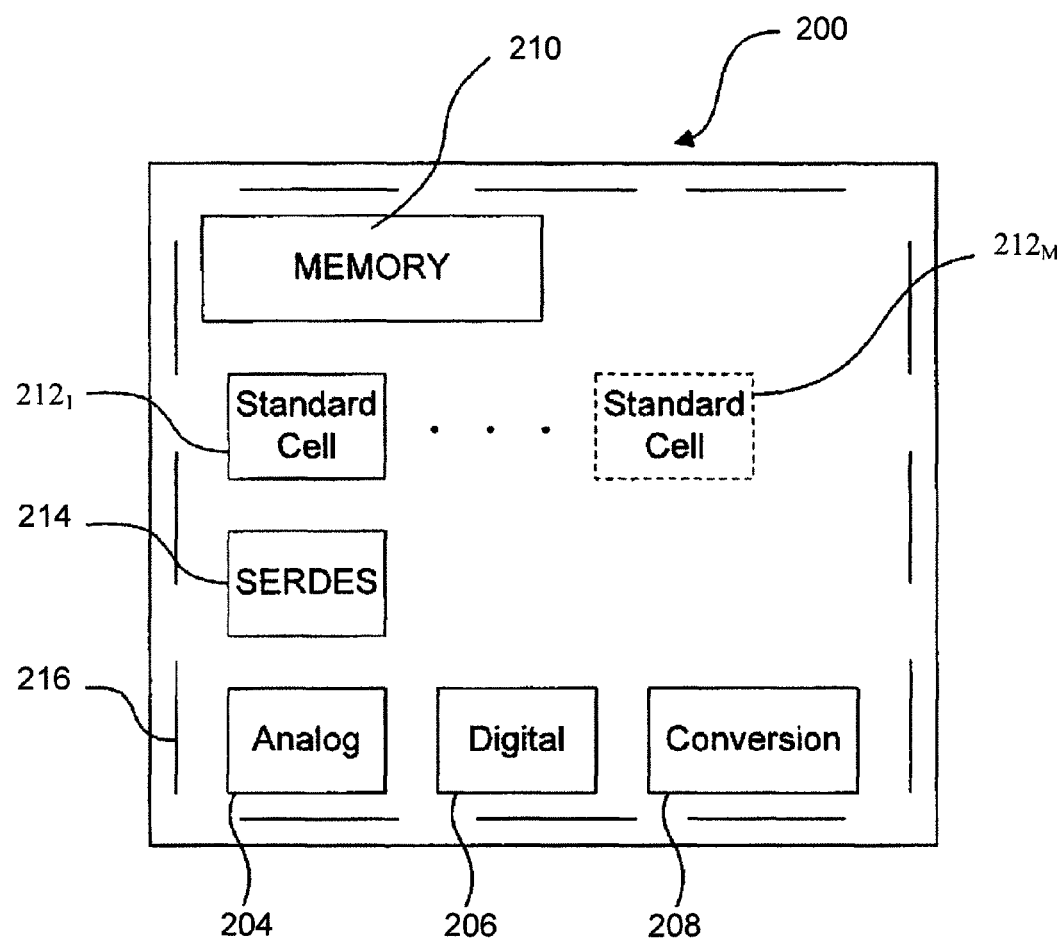
FIG. 2 illustrates an integrated circuit in accordance with one or more implementations.

FIG. 2 illustrates an integrated circuit 200 in accordance with one or more implementations. The integrated circuit 200 includes an analog portion 204, a digital portion 206, a conversion portion 208 (e.g., analog-to-digital and/or digital-to-analog conversions), a memory 210, and standard cells $212_1$-$212_M$. Optionally, the integrated circuit 200 includes a SERDES portion 214, which is a serial-deserializer device that converts input serial data to deserialized parallel data for use by the other portions of integrated circuit 200.

According to some implementations, elements 204-214 can be proprietary or manufacturer specific, with the normal exception of the standard cells $212_1$-$212_M$. The standard cells $212_1$-$212_M$ can vary in size based on a size and/or number of devices thereon, e.g., a size of logic devices (sometimes referred to as gates, and used interchangeably below) thereon or a number of logic devices thereon, to provide an optimal combination of size, signal propagation speed, or leakage. Each of the standard cells $212_1$-$212_M$ is designed to perform a specific function or set of functions or processes on a propagating signal. These functions are represented by combination of transistors forming various logic gates, as discussed in more detail below.

The fin-based multi-gate standard cell library 150 (FIG. 1) may include hundreds of standard cells, where the standard cells $212_1$-$212_M$ are a subset of the fin-based multi-gate standard cell library 150 and are selectively combined to design a larger circuit. Each of the standard cells $212_1$-$212_M$ in the library is associated with a specific logic function. Each logic function may be implemented in one or more predefined cells. For example, a logic function may have multiple layouts, each having different characteristics (e.g., timing characteristics).

Each of the standard cells $212_1$-$212_M$ in the fin-based multi-gate standard cell library 150 can be laid out relative to a grid defined by horizontal and vertical tracks. According to some implementations, the number of horizontal tracks defines the height of the cell and the number of vertical tracks defines the width of the cell. The fin-based multi-gate standard cell library 150 can be generally classified by its track height. For example, a 10-track library is composed of cells having heights of 10 horizontal tracks (or an integer multiple thereof). The widths of cells in a library may also vary. As such, the track height may be determined based on a desired amount of active area, clearance area, design rule check (DRC) constraints and performance requirements. Standard cells that have different track heights may not be combined by abutting their respective power and ground rails because of the difference in alignment. The standard cells $212_1$-$212_M$ may have the same track height (or integer multiple of that height).

The type and number of cells added to the fin-based multi-gate standard cell library 150 is dependent upon the efficiency required for the synthesis tool or application. Adding too many cells to the fin-based multi-gate standard cell library 150 may significantly reduce the efficiency of the synthesis tool and the quality of the resulting integrated circuit. This is because the synthesis tool may have difficulty handling a large number of choices. Accordingly, multi-threshold voltage cells may only be provided for the most used logic functions. Commonly used functions include, but are not limited to, AND gates, NAND gates, inverters, OR gates, NOR gates, and flip flops. The type of logic function implemented may be arbitrary or design dependent. As design tools become more sophisticated, the fin-based multi-gate standard cell library 150 can be further extended to include more complex combinational logic cells for a majority or all supported logic functions.

Figure 3:
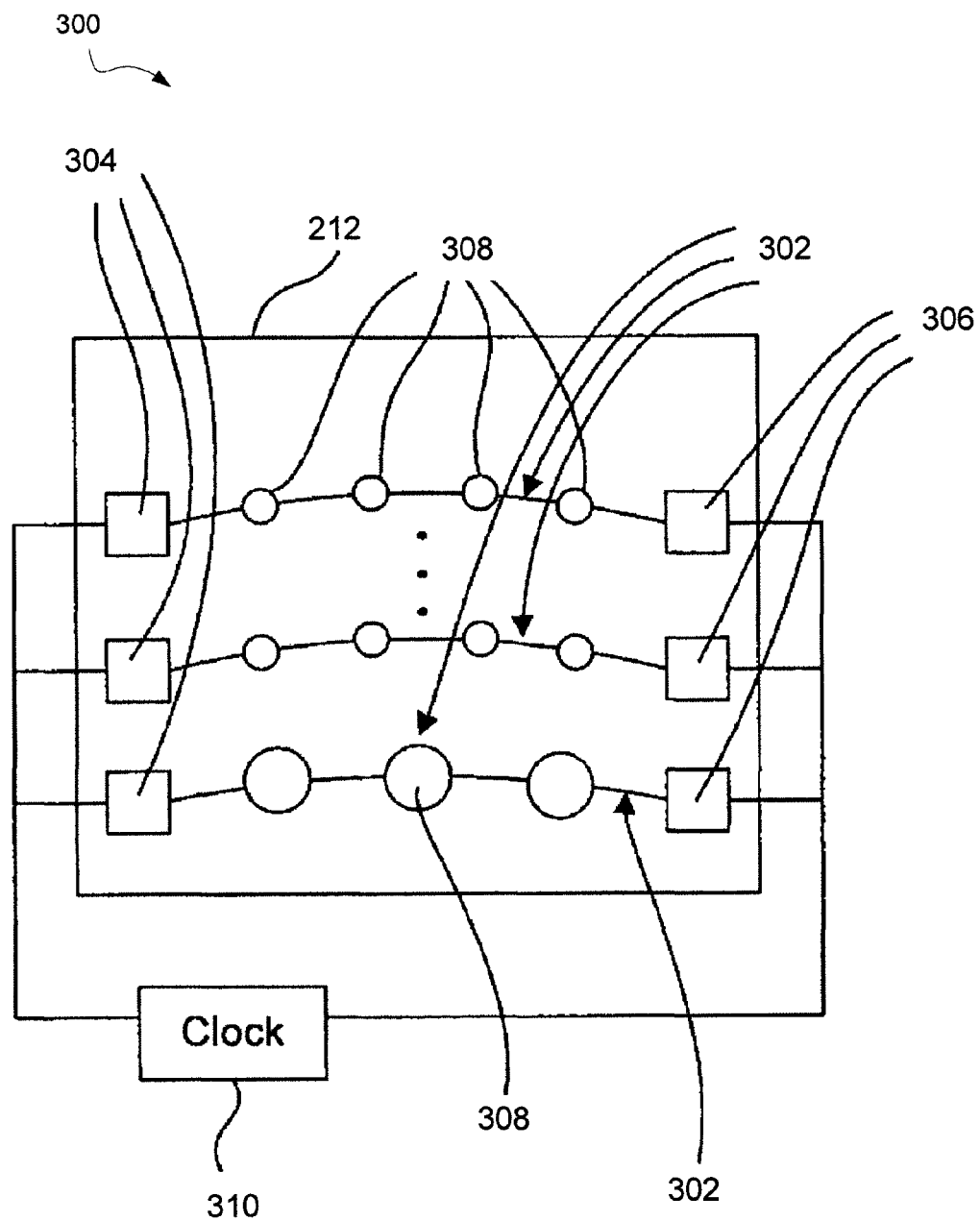
FIG. 3 illustrates a standard cell of the integrated circuit in accordance with one or more implementations.

FIG. 3 illustrates a standard cell 300 of the integrated circuit 200 illustrated in FIG. 2 in accordance with one or more implementations. At least one of the standard cells $212_1$-$212_M$ (FIG. 2) include one or more paths 302. Each end of a path 302 includes a corresponding first (e.g., starting) register 304 and second (e.g., ending) register 306. Each path 302 also includes logic devices 308 between the first and second registers 304 and 306. According to some implementations, the logic devices 308 are transistor-based logic devices that implement desired functions (e.g., NAND/NOR gates, inverters, or flip-flops). The logic devices 308 are used to perform one or more processes (e.g., implement one or more functions) on a propagating signal along each of the paths 302 as the signal propagates from being stored in the first register 304 to being stored in the second register 306.

Each of the registers 304 and 306 is coupled to a clock 310 that produces a clock signal setting a clock cycle. In operation, a signal is transmitted from the first register 304 along the path 302, at a first edge of the clock cycle, to be processed by the logic devices 308. At a second edge of the clock signal, the processed signal is received by the second register 306.

Each of the paths 302 may have a different propagation time based on the type of functions that are performed, the number of transistors or other similar components employed, or other characteristics of each logic device 308 along the path 302. One of the paths 302 has a propagation time that is larger than the propagation time of the other paths 302 between the first and second registers 304 and 306. The path 302 with the slowest propagation time is considered a critical path. The critical path can be the path that requires a reduction in the propagation time to ensure the propagating signal is received at the second register 306 within the clock cycle.

Figure 4:
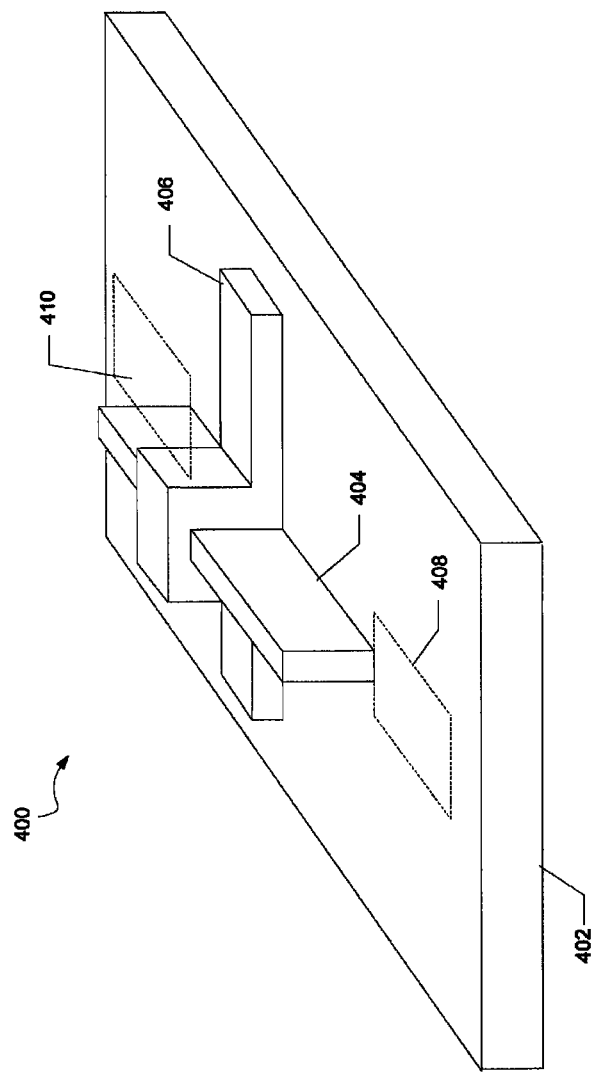
FIG. 4 illustrates a schematic diagram of a fin-based multi-gate transistor for use in the standard cell illustrated in FIG. 3 in accordance with one or more implementations.

FIG. 4 illustrates a perspective view of a fin-based multi-gate transistor 400 for use in the standard cell illustrated in FIG. 3 in accordance with one or more implementations. The fin-based multi-gate transistor 400 includes a non-conductive substrate 402 supporting a diffusion fin or a semiconductor fin 404. A gate structure 406 is deposited over a portion of the semiconductor fin 404 to form a gated channel between a source 408 and a drain 410. In effect, the gate structure 406 straddles or surrounds the semiconductor fin 404. During operation, current flows between the source 408 and the drain 410 along the gated sidewall surfaces of the semiconductor fin 404. According to some implementations, the gate structure 406 is formed using a poly-silicon material or a metal. The fin-based multi-gate transistor 400 may be applicable to various technologies, including but not limited to, complementary metal-oxide-semiconductors (CMOS), silicon-on-insulator (SOI), Gallium-Arsenide (GaAs), and Silicon-Germanium (SiGe). Because the physical depictions in the figures should not be interpreted as limiting, the fin-based multi-gate transistor 400 may be applicable to double-gate transistors, tri-gate transistors, all-around-gate transistors, and various other implementations of semiconductor devices with quantification.

According to some implementations, an integrated circuit is formed using multiple semiconductor fins along an axis that is orthogonal with gate structures (or poly-silicon layers) running parallel to one another across the integrated circuit. The intersection of the semiconductor fin 404 and the gate structure 406 over an active material deposited on the substrate 402 forms a transistor. As such, the integrated circuit can be arranged as a grid where multiple grid points represent this intersection. Accordingly, each transistor can be located at a corresponding grid point of the integrated circuit based on the spatial relationship between the semiconductor fin 404 and the gate structure 406. The spacing between the multiple semiconductor fins defines a fin pitch. Similarly, the spacing between the gate structures defines a gate pitch. The fin-based multi-gate transistor 400 is not limited to the implementation shown in FIG. 4, and can be implemented with various configurations and structures.

FIGS. 5A-5F illustrate layouts of fin-based structures in accordance with one or more implementations. Based on the fin-based multi-gate transistor 400 as discussed in FIG. 4, a standard cell can be represented as a block having multiple types of sub-cells, in which each type of sub-cell has a different (or unique) layout that corresponds to a different structure with geometric regularity. As such, there can be multiple instances of each type of sub-cell in a single standard cell. The standard cell is represented as an array of sub-cells, where each sub-cell has geometric regularity with adjacent sub-cells. Because the sub-cells can be interchangeable with one another, device characteristics of the standard cell can be adjusted dynamically (or on-the-fly) depending on the speed/leakage requirements of the standard cell.

As stated above, the gate structure 406 of FIG. 4 can straddle or surround the semiconductor fin 404 structure to form the body of the transistor. Alternatively, the gate structure 406 can be divided into separate portions such that each portion is located on opposite sides of the semiconductor fin 404 rather than having the gate structure 406 straddle the semiconductor fin 404. As a further alternative, the gate structure 406 can wrap all around the semiconductor fin 404 (e.g., all-around-gate).

Figure 5:
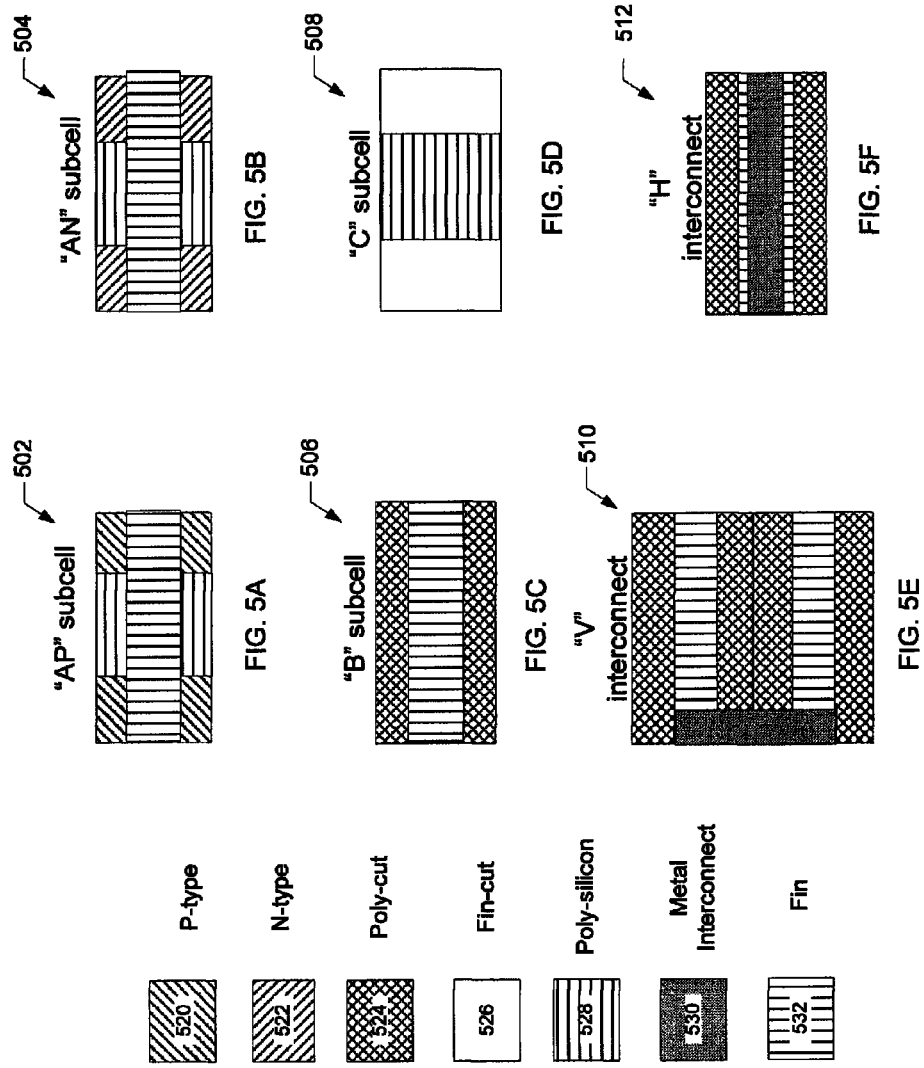
FIGS. 5A-5F illustrate layouts of fin-based circuits in accordance with one or more implementations.

Referring to FIG. 5A, a sub-cell 502 is composed of a p-type 520, a poly-silicon 528 and a fin 532. Here, portions of the poly-silicon 528 are located on opposite sides of the fin 532. The intersection of the fin 532 and the poly-silicon 528 over the p-type 520 forms a p-transistor. The p-transistor is configured to toggle (or power on) on a negative transition of a pulse signal or logical low ("0"). In operation, current flows from the drain to the source via the fin 532.

Referring to FIG. 5B, a sub-cell 504 is composed of an n-type 522, the poly-silicon 528 and the fin 532. Similarly to the sub-cell 502, the intersection of the fin 532 and the poly-silicon 528 over the n-type 522 forms an n-type transistor. In operation, current flows from the source to the drain via the fin 532.

Referring to FIG. 5C, a sub-cell 506 (represented as poly-cut 524) is composed of only the fin 532. According to some implementations, the sub-cell 506 has the poly-silicon 528 printed then cut (or etched out) from the sub-cell where appropriate. As such, the sub-cell 506 can be composed of only the substrate and the remaining fin structure.

Referring to FIG. 5D, a sub-cell 508 (represented as fin-cut 526) is composed of only the poly-silicon 528. According to some implementations, the sub-cell 508 has the fin 532 printed then cut (or etched out) from the sub-cell where appropriate. As such, the sub-cell 508 can be composed of only the substrate and the remaining poly-silicon structure.

Because the sub-cells 506 and 508 contain no active material over the substrate, the sub-cells 506 and 508 can each be defined as a non-active sub-cell while the sub-cells 502 and 504 are defined as active sub-cells according to their respective active material. The sub-cells 506 and 508 can be configured to provide spacing around the active sub-cells and in between the active sub-cells.

Referring to FIG. 5E, a metal interconnect 530 is configured to couple semiconductor fins of adjacent sub-cells located parallel to one another. The metal interconnect 530 can also be configured to distribute supply rails (e.g., power and ground) to the active sub-cells. The metal interconnect 530 as illustrated in FIG. 5E provides a configuration that defines a vertical interconnect because the interconnection is running across rows of fins. According to some implementations, the length of the interconnection between a pair of fins is based on the fin pitch. As stated above, the fin pitch is defined as the spacing between two parallel fins.

Referring to FIG. 5F, the metal interconnect 530 is configured to couple semiconductor fins of adjacent sub-cells located in series with one another. Here, the metal interconnect 530 runs parallel with the fin 532 but orthogonal with the poly-silicon 528. The metal interconnect 530 in this configuration is defined as a horizontal interconnect because the interconnection is running across columns of poly-silicon layers (or gate structures). The sub-cells 502-512 are not limited to the implementations shown in FIGS. 5A-5F, and can be implemented with various configurations and structures as permitted under finFET design-rule restrictions.

Figure 6:
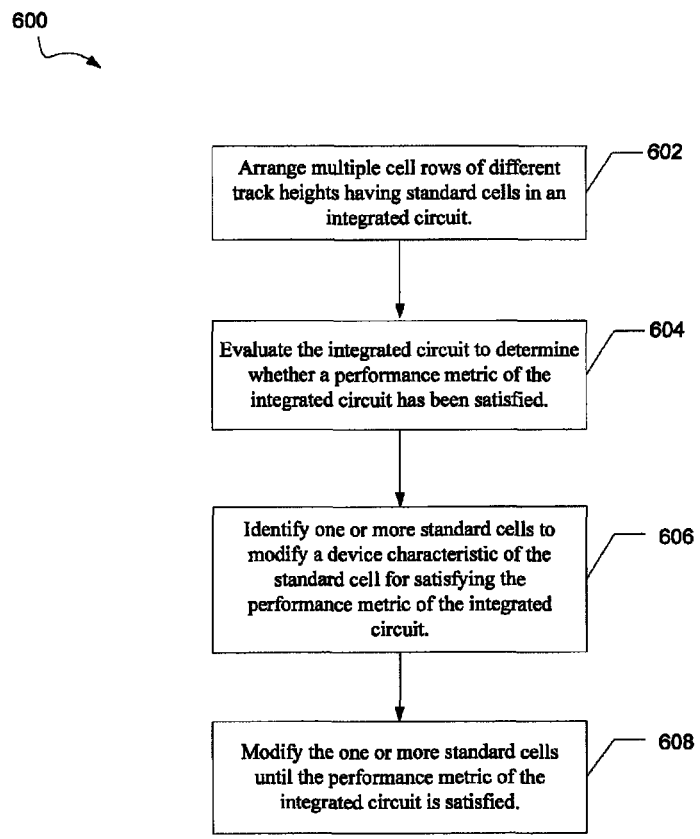
FIG. 6 illustrates a flow diagram of a method for optimizing fin-based multi-gate transistors of a standard cell library in accordance with one or more implementations.

FIG. 6 illustrates a flow diagram of a method 600 for optimizing fin-based multi-gate transistors of a standard cell library in accordance with one or more implementations. According to some implementations, the method 600 is not limited to the order illustrated in FIG. 6, and can be performed, executed or processed in a different order capable of optimizing fin-based multi-gate transistors.

The method 600 includes arranging multiple cell rows of different track heights having standard cells, in which each of the standard cells also includes multiple sub-cell rows with sub-cells of one or more types. (602). The sub-cells are interchangeable with one another to modify a device characteristic of the standard cell. The method 600 also can include providing power rails between the cell rows, wherein each of the power rails are distanced from one another according to the different track heights.

The method 600 also includes evaluating the integrated circuit to determine whether a performance metric of the integrated circuit has been satisfied (604). For example, the performance metric relates to area/speed/power requirements of the integrated circuit. In evaluating the integrated circuit, the method 600 can include performing a static timing analysis that yields a timing result of a particular circuit path of the integrated circuit. For example, the static timing analysis may include identifying a register-to-register path for evaluating a setup/hold timing of each register. Such setup/hold timing can also determine whether the register-to-register path is a critical path.

The method 600 also includes identifying one or more standard cells to modify a device characteristic of the standard cell for satisfying the performance metric of the integrated circuit (606). In identifying the one or more standard cells, the method 600 can include detecting at least one of the cell rows having all standard cells with one or more of the sub-cell rows complete with non-active sub-cells. As such, the row having only standard cells with at least one collapsible row can be modified (or adjusted) to decrease an associated track height.

The method 600 also includes modifying the one or more standard cells until the performance metric of the integrated circuit is satisfied (608). In modifying the one or more standard cells, the method 600 can include collapsing the at least one of the cell rows proportionate to a number of the sub-cell rows identified to be complete with non-active sub-cells. In collapsing the cell rows, the method 600 can include removing a same number of sub-cell rows from each standard cell of the cell row in order to decrease a track height of the cell row by the same number.

The cell row may initially be configured as a 10-track height cell row. However, one or more sub-cell rows may collapse by a finite amount to cause the standard cells of the cell row to decrease in track height. For example, if two sub-cell rows are collapsed, the standard cell with the 10-track height is reduced to an 8-track height. In doing so, the standard cell may be reconfigured to have two fins removed (or cut) from the standard cell to denote the decrease in track height since the track height can be a function of the number of semiconductor fins formed in the standard cell. According to some implementations, another row might be collapsed into a 9-track height, resulting in a mix of row heights closer to an area/power optimal solution compared to the original mapping. As such, the method 600 can include rearranging the integrated circuit with multiple cell rows of different track heights.

In modifying the one or more standard cells, the method 600 also can include interchanging between different types of sub-cells for each identified standard cell. In interchanging between the different types of sub-cells, the method 600 can include interchanging at least one of the sub-cells from being a non-active sub-cell to being an active sub-cell, or from being an active sub-cell to being a non-active sub-cell. In particular, the method 600 can include interchanging from an non-active sub-cell to an active sub-cell based on a determination that the active sub-cell is of a first type and the non-active sub-cell is located in a region of the standard cell having active sub-cells of the first type. Similarly, the method 600 can include interchanging from an non-active sub-cell to an active sub-cell based on a determination that the active sub-cell is of a second type and the non-active sub-cell is located in a region of the standard cell having active sub-cells of the second type. For example, the standard cell may be divided in half where one half is occupied by p-type transistors while the other half is occupied by n-type transistors.

In one or more implementations, the method 600 includes selecting one or more standard cells with an associated track height from a standard cell library. A logic depth of a corresponding logic function for the standard cell may also be determined in advance. A propagation delay of the logic depth may be determined in advance to select the proper track height that satisfies the estimated propagation delay. Determining the logic depth also includes obtaining performance characteristics for different track heights. Based on the estimated propagation delay, a track height that provides a latency through the standard cell that is at least equal to the estimated propagation delay of the logic depth can be selected as a default selection. Providing power and ground to the block of sub-cells at locations between the cell rows can also be part of determining the block of sub-cells.

Figure 7B:
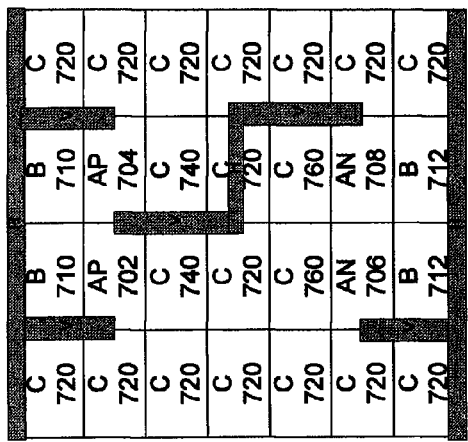
FIGS. 7A-7C illustrate a circuit topology with a first transistor drive in accordance with one or more implementations.
Figure 7A:
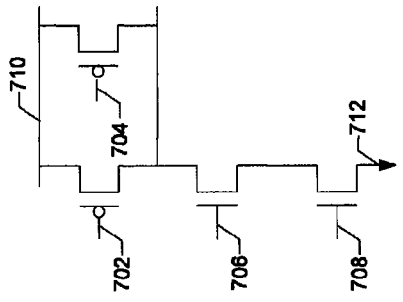
Figure 7C:
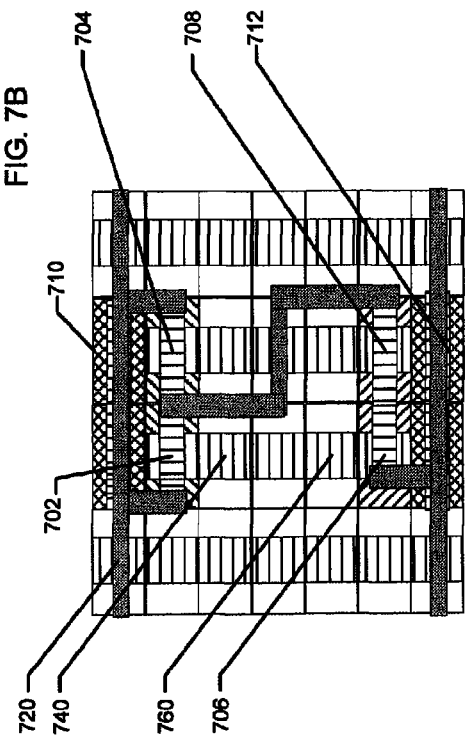

FIGS. 7A-7C illustrate a circuit topology with a first transistor drive in accordance with one or more implementations. Referring to FIG. 7A, a schematic diagram of a two-way NAND circuit defining the circuit topology is provided.

According to some implementations, other combinational logic gates (e.g., OR gates, NOR gates, AND gates, XOR gates, inverters) including state-holding elements (e.g., flip-flops) are implemented with the fin-based multi-gate transistors of the fin-based multi-gate standard cell library 150 (FIG. 1). Here, the schematic diagram provides two p-type transistors 702 and 704 connected in parallel, and coupled to two n-type transistors connected in series to form the two-way NAND circuit. The output of the NAND circuit is defined as the shared node between the source electrodes of the p-type transistors 702 and 704 and the source electrode of the n-type transistor 706. In operation, the p-type transistors are triggered on a negative transition of the input (or a logical low) while the n-type transistors are triggered on a positive transition of the input (or logical high). When triggered, the p-type transistors 702 and 704 are pulled up to a supply rail 710 (or VDD), whereas the n-type transistors 706 and 708 are pulled down to a supply rail 712 (or VSS) or ground.

Referring to FIG. 7B, the circuit topology may be represented as a block diagram, where each sub-cell in the block diagram represents a building block (active or non-active) to form the two-way NAND circuit. In a fin-based multi-gate standard cell library for designing a circuit, the circuit may include multiple cells arranged according to a first pitch to form rows and a second pitch to form columns. The rows may define a track height of the circuit based on a logic depth of a corresponding logic function. The sub-cells may include active sub-cells configured to be interchangeable with one another when the active sub-cells are of a same type. The sub-cells also include non-active sub-cells located at least between active sub-cells of different types and are further configured to be interchangeable with one another including active sub-cells of the same type.

The track height may be configured to decrease when one or more rows populated with only non-active sub-cells are removed from the standard cell. That is, the row is collapsed to reduce the number of rows present in the standard cell. The active sub-cells may include at least one of a p-type transistor and an n-type transistor. Active sub-cells determined to be of the same type can include at least one of the p-type transistor and the n-type transistor. The non-active sub-cells are configured to provide null functionality in one or more portions of the standard cell. That is, non-active sub-cells contain no active material, and therefore the non-active sub-cells are not configured to perform a logic function (or operation). For example, the non-active sub-cells can operate as a buffer (or a spacer).

Here, the NAND circuit is defined as a 4x7 block using multiple fin-based structures as building blocks, where the NAND circuit has a track width of four and a track height of seven. For example, the p-type transistors 702 and 704 are represented as "AP" blocks, the n-type transistors 706 and 708 are represented as "AN" blocks, and the supply rails 710 and 712 (e.g., VDD, GND) are represented via the horizontal and vertical interconnect layers (e.g., metal interconnect layer 530 of FIGS. 5E and 5F). The "B" and "C" blocks represent blocks with null functionality (or non-active sub-cells) since these blocks do not contain any active material, and are configured to provide spacing around and between active sub-cells within the circuit according to design-rule check (DRC) requirements. The block diagram also include vertical and horizontal interconnect layers to connect the supply rails to the transistors and connect between the p-type and n-type transistors. The interconnect layers may be non-active sub-cells that are configured to operate as connectors to connect adjacent cells. For example, the horizontal connector runs parallel with the first pitch of the block diagram (e.g., semiconductor fin layer), and the vertical connector runs parallel with the second pitch (e.g., poly-silicon layer or gate structure).

Referring to FIG. 7C, a conceptual layout of the NAND circuit illustrated in FIG. 7B is provided. As stated above, the NAND circuit is defined as a 4x7 block using multiple fin-based structures as building blocks, where the NAND circuit has a track width of four and a track height of seven. As such, the NAND circuit can be formed using seven semiconductor fins and four poly-silicon structures to define the 4x7 array. The intersection of the semiconductor fins and poly-silicon structures over active material forms a corresponding transistor. Because of the geometric regularity of the sub-cells employed in the NAND circuit, individual transistors can be interchanged with non-active sub-cells to provide different characteristics to the standard cell. For example, non-active sub-cells 740, which are adjacent to the p-type transistors 702 and 704, can be interchanged with other p-type transistors to increase the drive strength of the p-type transistors. As a result, the transistor ratio of p-type to n-type transistors (e.g., P/N) increases due to the additional p-type transistors added to the NAND circuit.

As illustrated in the conceptual layout, the blocks 702-712, 720, 740 and 760 are represented by the fin-based multi-gate transistor building blocks illustrated in FIGS. 5A-5D. In addition, interconnect structures as those illustrated in FIGS. 5E and 5F are employed to interconnect the blocks 702-712, 720, 740 and 760 where appropriate to form the NAND circuit illustrated in FIG. 7B. Each of the blocks is arranged in rows and columns, and are interchangeable due to their geometric regularity. That is, at compile time, the blocks can be dynamically exchanged with other blocks based on speed/leakage requirements of a particular circuit path. According to some implementations, the conceptual layout based on the fin-based multi-gate transistors is not limited to the configuration or implementation of the NAND circuit in FIG. 7C.

FIGS. 8A-8C illustrate the circuit topology with a second transistor drive in accordance with one or more implementations. Referring to FIG. 8A, a schematic diagram of a two-way NAND circuit defining the circuit topology is provided with additional drive strength compared to the NAND circuit illustrated in FIG. 7A. Here, one half of the schematic diagram provides a first parallel connection of p-type transistors 802 and 822 which are connected in parallel to a second parallel connection of p-type transistors 804 and 824. The other half of the schematic diagram provides a first series connection of n-type transistors 806 and 808 which are connected in parallel to a second series connection of n-type transistors 826 and 828. In effect, the transistor ratio of p-type transistors to n-type transistors is 1:1.

The output of the NAND circuit is defined as the shared node between the source electrodes of the p-type transistors 822 and 824 and the source electrodes of the n-type transistors 806 and 826. In operation, the p-type transistors are triggered on a negative transition of the input (or a logical low) while the n-type transistors are triggered on a positive transition of the input (or logical high). When triggered, the p-type transistors 802, 804, 822 and 824 are pulled up to a supply rail 810 (or VDD), whereas the n-type transistors 806, 808, 826, 828 are pulled down to a supply rail 812 (or VSS) or ground.

Referring to FIG. 8B, a block diagram representing the NAND circuit illustrated in FIG. 8A is provided and is closely similar in the layout footprint of the block diagram illustrated in FIG. 7B. However, the non-active sub-cells 740 (FIG. 7B) are interchangeable with corresponding active sub-cells (e.g., p-type transistors) to increase the p-transistor drive strength of the circuit. Similarly, the non-active sub-cells 760 (FIG. 7B) are interchangeable with corresponding active sub-cells (e.g., n-type transistors) to increase the n-transistor drive strength of the standard cell. As such, the block diagram in FIG. 8B is adjusted by interchanging the non-active sub-cells 740 with p-type transistors 822 and 824 including the non-active sub-cells 760 with n-type transistors 826 and 828. In doing so, the vertical interconnect structures are extended to reach the additional transistors previously occupied by the non-active sub-cells in order to supply power and ground to the newly-added transistors.

Referring to FIG. 8C, a conceptual layout of the NAND circuit illustrated in FIG. 8B is provided. As illustrated in the conceptual layout, the blocks 802-812 and 820-828 are represented by the fin-based multi-gate transistor building blocks illustrated in FIGS. 5A-5D. In addition, interconnect structures as those illustrated in FIGS. 5E and 5F are employed to interconnect the blocks 802-812 and 820-828 where appropriate to form the NAND circuit illustrated in FIG. 8B with the additional drive strength. Each of the blocks is arranged in rows and columns, and are interchangeable due to their geometric regularity. That is, at compile time, the blocks can be dynamically exchanged with other blocks based on speed/leakage requirements of a particular circuit path. According to some implementations, the conceptual layout based on the fin-based multi-gate transistors is not limited to the configuration or implementation of the NAND circuit in FIG. 8C.

FIGS. 9A-9C illustrate the circuit topology with a first transistor ratio in accordance with one or more implementations. Referring to FIG. 9A, a schematic diagram of a two-way NAND circuit defining the circuit topology is provided with additional drive strength compared to the NAND circuit illustrated in FIG. 8A. Here, one half of the schematic diagram provides a first parallel connection of p-type transistors 902 and 922 which are connected in parallel to a second parallel connection of p-type transistors 904 and 924. The other half of the schematic diagram provides a series connection of n-type transistors 906 and 908. In effect, the transistor ratio of p-type transistors to n-type transistors is 2:1 for a higher P/N ratio compared to the circuit topology illustrated in FIG. 8A.

The output of the NAND circuit is defined as the shared node between the source electrodes of the p-type transistors 922 and 924 and the source electrode of the n-type transistor 906. In operation, the p-type transistors are triggered on a negative transition of the input (or a logical low) while the n-type transistors are triggered on a positive transition of the input (or logical high). When triggered, the p-type transistors 902, 904, 922 and 924 are pulled up to a supply rail 910 (or VDD), whereas the n-type transistors 906 and 908 are pulled down to a supply rail 912 (or VSS) or ground.

Referring to FIG. 9B, a block diagram representing the NAND circuit illustrated in FIG. 9A is provided and is closely similar in the layout footprint of the block diagram illustrated in FIG. 8B. However, the active sub-cells (or the n-type transistors 826 and 828 of FIG. 8B) are interchanged with non-active sub-cells 960, which decreases the n-transistor drive strength of the circuit but maintains the drive strength for the p-type transistors. In doing so, the vertical interconnect structure with respect to the n-type transistor 906 is reduced in length due to the substitution (or exchange) of the n-type transistors 826 and 828 illustrated in FIG. 8B with the non-active sub-cells 960.

Referring to FIG. 9C, a conceptual layout of the NAND circuit illustrated in FIG. 9B is provided. As illustrated in the conceptual layout, the blocks 902-912 and 920-924 are represented by the fin-based multi-gate transistor building blocks illustrated in FIGS. 5A-5D. In addition, interconnect structures as those illustrated in FIGS. 5E and 5F are employed to interconnect the blocks 902-912 and 920-924 where appropriate to form the NAND circuit illustrated in FIG. 9B with p-type transistors having a higher drive strength than n-type transistors. Each of the blocks is arranged in rows and columns, and are interchangeable due to their geometric regularity. That is, at compile time, the blocks can be dynamically exchanged with other blocks based on speed/leakage requirements of a particular circuit path. According to some implementations, the conceptual layout based on the fin-based multi-gate transistors is not limited to the configuration or implementation of the NAND circuit in FIG. 9C.

FIG. 10A-10C illustrate the circuit topology with a second transistor ratio in accordance with one or more implementations. Referring to FIG. 10A, a schematic diagram of a two-way NAND circuit defining the circuit topology is provided with additional drive strength compared to the NAND circuit illustrated in FIG. 9A. Here, one half of the schematic diagram provides two p-type transistors 1002 and 1004 connected in parallel and coupled to a second half of the schematic diagram. The second half of the schematic diagram provides a first series connection of n-type transistors 1006 and 1008 which are connected in parallel to a second series connection of n-type transistors 1026 and 1028. In effect, the circuit topology provides a 1 to 2 ratio of p-type transistors to n-type transistors for a lower P/N ratio compared to the circuit topology illustrated in FIG. 8A.

The output of the NAND circuit is defined as the shared node between the source electrodes of the p-type transistors 1002 and 1004 and the source electrodes of the n-type transistors 1006 and 1026. In operation, the p-type transistors are triggered on a negative transition of the input (or a logical low) while the n-type transistors are triggered on a positive transition of the input (or logical high). When triggered, the p-type transistors 1002 and 1004 are pulled up to a supply rail 1010 (or VDD), whereas the n-type transistors 1006, 1008, 1026 and 1028 are pulled down to a supply rail 1012 (or VSS) or ground.

Referring to FIG. 10B, a block diagram representing the NAND circuit illustrated in FIG. 10A is provided and is closely similar in the layout footprint of the block diagram illustrated in FIG. 8B. However, the active sub-cells (or the p-type transistors 1022 and 1024 of FIG. 8B) are interchanged with non-active sub-cells 1060, which decreases the p-transistor drive strength of the standard cell but maintains the drive strength for the n-type transistors. In doing so, the vertical interconnect structures with respect to the p-type transistors 1002 and 1004 are reduced in length due to the substitution (or exchange) of the p-type transistors 826 and 828 illustrated in FIG. 8B with the non-active sub-cells 1040.

Referring to FIG. 10C, a conceptual layout of the NAND circuit illustrated in FIG. 10B is provided. As illustrated in the conceptual layout, the blocks 1002-1012, 1020 and 1026-1028 are represented by the fin-based multi-gate transistor building blocks illustrated in FIGS. 5A-5D. In addition, interconnect structures as those illustrated in FIGS. 5E and 5F are employed to interconnect the blocks 1002-1012, 1020 and 1026-1028 where appropriate to form the NAND circuit illustrated in FIG. 10B with n-type transistors having a higher drive strength than p-type transistors. Each of the blocks is arranged in rows and columns, and are interchangeable due to their geometric regularity. That is, at compile time, the blocks can be dynamically exchanged with other blocks based on speed/leakage requirements of a particular circuit path. According to some implementations, the conceptual layout based on the fin-based multi-gate transistors is not limited to the configuration or implementation of the NAND circuit in FIG. 1-C.

FIG. 11 illustrates a side-by-side comparison of conceptual block diagrams before and after optimization in accordance with one or more implementations. Removal of rows from the block is based on one or more rows collapsing when the row occupies only non-active sub-cells. Accordingly, the track height of the block may be decreased by the number of rows collapsing in the block. According to some implementations, the row is collapsible when the row contains all non-active sub-cells (e.g., all sub-cells 1120 or all sub-cells 1140).

According to some implementations, the sub-cells collectively form a block that is configured to abut adjacent blocks in an integrated circuit. The integrated circuit may include multiple blocks arranged in rows of different track heights of the integrated circuit. For example, an 8-track height row can be adjacent to a 10-track height row and a 9-track height row. Each row includes blocks of a same track height. This is because each row is bounded by power and ground rails that require blocks with the same track height so that the rails align properly along the row. For example, the integrated circuit provides supply rails between each of the rows to supply power and ground to each of the blocks. The rows of the integrated circuit can collapse when each standard cell along that row has a complete row of non-active sub-cells. As a result, the integrated circuit can decrease in area according to a number of rows collapsing in the integrated circuit. Alternatively, the blocks may be configured to move to a row with a different track height when the block is reconfigured with a new track height in response to a complete row of non-active sub-cells collapsing in the block.

erring to FIG. 11, a block diagram 1100 depicts a circuit topology before optimization of area. Here, the block diagram 1100 is a 4x6 block having multiple cells arranged as a grid array. As stated above, rows having only non-active sub-cells (e.g., sub-cells 1120) can be collapsed, and the void area can be recovered to reduce the overall size of an integrated circuit. The block diagram 1100 includes active sub-cells 1160 (e.g., p-type transistors) and active sub-cells 1180 (e.g., n-type transistors) which are separated by non-active sub-cells 1120 (e.g., "C" sub-cells) and non-active sub-cells 1140 (e.g., "B" sub-cells). Because the second row from the top is occupying only non-active sub-cells 1120, the second row can be collapsed (or removed) from the block diagram.

block diagram 1150 depicts the circuit topology after optimization of the area. The block diagram 1150 occupies less area than the block diagram 1100, and has a track height of five compared to a track height of six for the block diagram 1100. Alternatively, the block diagram 1100 can be increased in size depending on the speed/leakage requirements of a particular critical path of the integrated circuit. That is, one or more rows may be added to the block diagram 1100 to form a larger-sized footprint with additional active sub-cells and/or non-active sub-cells. According to some implementations, the physical or conceptual layouts based on the fin-based multi-gate transistors are not limited to the configuration or implementation of the circuit topology illustrated in FIG. 11.

Figure 12:
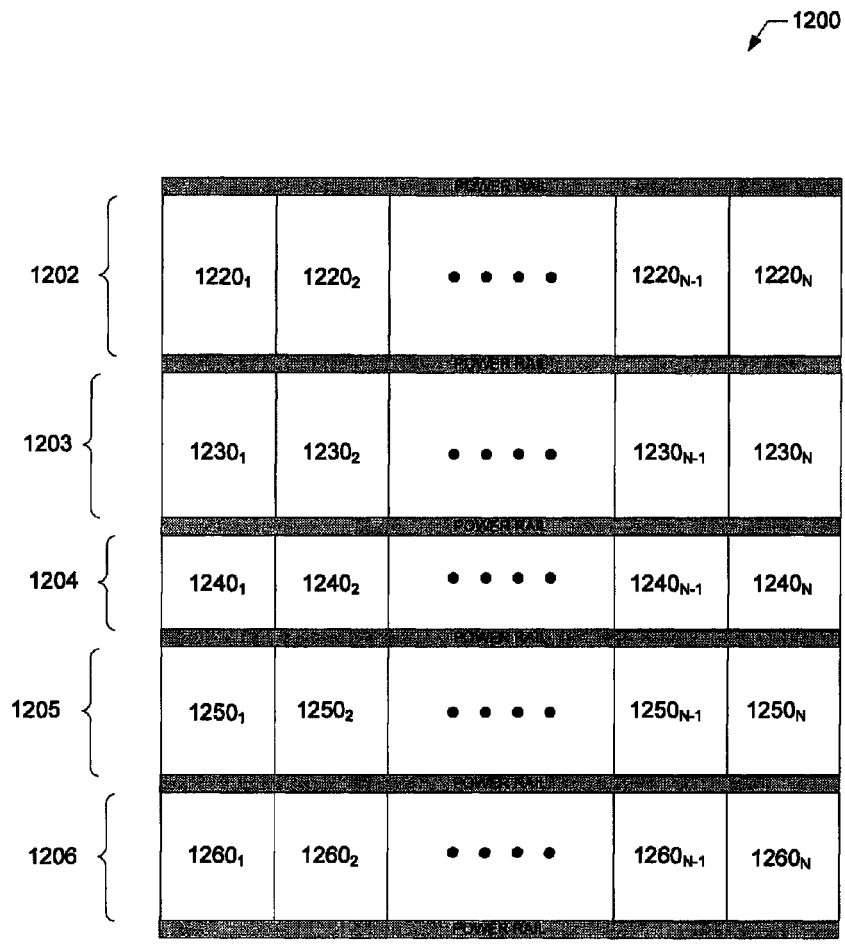
FIG. 12 illustrates a schematic diagram of an integrated circuit with different track heights in accordance with one or more implementations.

FIG. 12 illustrates a schematic diagram of an integrated circuit 1200 with different track heights in accordance with one or more implementations. Not all of the depicted components may be required, however, and one or more implementations may include additional components not shown in the figure. Variations in the arrangement and type of the components may be made without departing from the spirit or scope of the claims as set forth herein. Additional, different or fewer components may be provided.

According to some implementations, the integrated circuit 1200 uses fin-based cells of the standard cell library 150 (FIG. 1). The integrated circuit 1200 includes multiple cell rows (e.g., cell rows 1202-1206) of different track heights having standard cells (e.g., 1220$_1$-1220$_N$, 1230$_1$-1230$_N$, 1240$_1$-1240$_N$, 1250$_1$-1250$_N$, 1260$_1$-1260$_N$) of a same track height for each cell row. Each of the standard cells includes multiple sub-cell rows with sub-cells of one or more types. The sub-cells are interchangeable with one another to modify a device characteristic of the standard cell.

The integrated circuit 1200 also includes multiple power rails located between the cell rows 1202-1206, which are configured to supply power to the standard cells. The cell rows are located between the plurality of power rails. According to some implementations, the power rails can be configured to provide positive power (e.g., positive voltage or VDD), negative power (e.g., negative voltage or VSS), or a common ground. For example, the power rail located directly above the cell row 1202 can be configured as VDD, and the power rail located directly below the cell row 1202 can be configured as VSS. Because the physical depictions in the figures should not be interpreted as limiting, the power rails can be configured or implemented in any manner consistent with the subject disclosure.

Here, the integrated circuit 1200 is implemented with cell rows of different track heights based on the optimization process of standard cells for each cell row as discussed in FIG. 11. As such, the integrated circuit 1200 can be formed with track heights that are practically feasible and consistent with the speed/leakage requirements athe integrated circuit 1200. In this regard, the integrated circuit 1200 includes the cell row 1202 of track height ten (10) and composed of sub-cells 1220$_1$-1220$_N$. The cell row 1202 is located adjacently to the cell row 1203 of track height nine (9) and composed of sub-cells 1230$_1$-1230$_N$, which is located adjacently to the cell row 1204 of track height six (6) and composed of sub-cells 1240$_1$-1240$_N$. The cell row 1204 is located adjacently to the cell row 1205 of track height eight (8) and composed of sub-cells 1250$_1$-1250$_N$, which is located adjacently to the cell row 1206 of track height eight (8) and composed of sub-cells 1260$_1$-1260$_N$. As depicted in FIG. 12, the cell rows 1202-1206 can be reconfigured into a wide range of different track heights and co-located on the same integrated circuit.

According to some implementations, each of the standard cells is composed of active sub-cells and non-active sub-cells. The non-active sub-cells provide null functionality in one or more sections of the standard cell. The active sub-cells can include a first type of active sub-cells and a second type of active sub-cells. The first type of active sub-cells can be a p-type transistor and the second type of active sub-cells can be an n-type transistor. In one or more implementations, the first type of active sub-cells are assigned to a first region of the standard cell and the second type of active sub-cells are assigned to a second region of the standard cell. Because the sub-cells are interchangeable with one another, the sub-cells can have a sub-cell modified from being anon-active sub-cell to being an active sub-cell in order to increase a drive strength characteristic of the standard cell.

The sub-cells can be interconnected with metal connectors (not shown) that electrically couple to a semiconductor fin of each sub-cell. The metal connectors can include a horizontal connector that electrically couples a source node to a drain node of a same transistor. The metal connectors also can include a vertical connector that electrically couples source nodes or drain nodes of two or more consecutive semiconductor fins in a standard cell.

Figure 13:
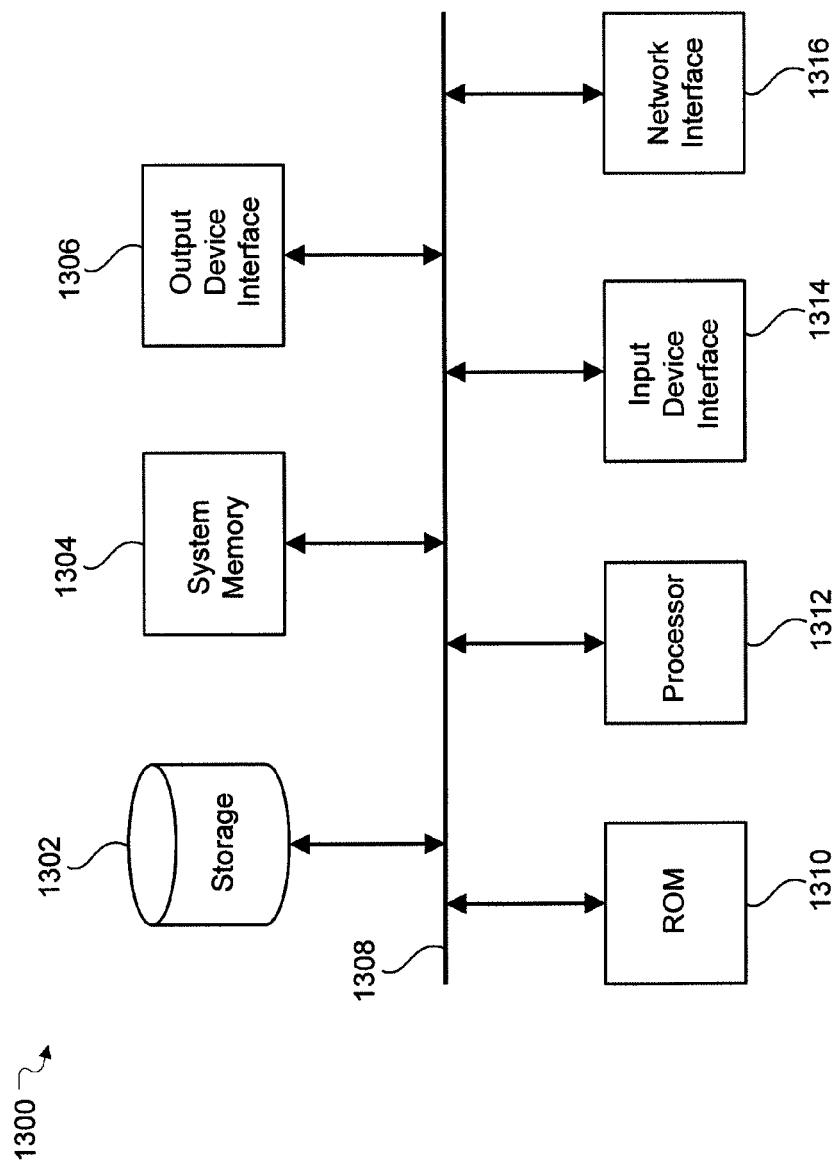
FIG. 13 conceptually illustrates a single or multi-chip module using multiple threshold voltage standard cells in an electronic system in accordance with one or more implementations.

FIG. 13 conceptually illustrates an electronic system 1300 in accordance with one or more implementations. The electronic system 1300 includes a bus 1308, processing unit(s) 1312, a system memory 1304, a read-only memory (ROM) 1310, a permanent storage device 1302, an input device interface 1314, an output device interface 1306, and a network interface 1316, or subsets and variations thereof According to some implementations, a non-transitory machine-readable medium embodying instructions that, when executed by a machine, cause the machine to perform a method of optimizing a layout of an integrated circuit formed using fin-based cells of a standard cell library. The non-transitory machine-readable medium can be implemented as the permanent storage device 1302 or the ROM 1310. The machine can be implemented as the processing unit 1312.

Accordingly, the processing unit 1312 can perform the method that includes arranging multiple cells rows of different track heights having standard cells. Each of the standard cells also includes multiple sub-cell rows with sub-cells of one or more types, in which each of the sub-cells are interchangeable with one another to modify a device characteristic of the standard cell. The processing unit 1312 can also provide multiple power rails to be placed between the cell rows of the integrated circuit. Each of the power rails are distanced from one another according to the different track heights. The processing unit 1312 also can evaluate the standard cells to determine whether a performance metric of the integrated circuit has been satisfied. The processing unit 1312 also can identify one or more standard cells to modify a device characteristic of the standard cell for satisfying the performance metric of the integrated circuit. The processing unit 1312 can further modify the one or more standard cells until the performance metric of the integrated circuit is satisfied.

The bus 1308 collectively represents all system, peripheral, and chipset buses that communicatively connect the numerous internal devices of electronic system 1300. In one or more implementations, the bus 1308 communicatively connects the processing unit(s) 1312 with the ROM 1310, the system memory 1304, and the permanent storage device 1302. From these various memory units, the processing unit(s) 1312 retrieves instructions to execute and data to process in order to execute the processes of the subject disclosure. The processing unit(s) can be a single processor or a multi-core processor in different implementations.

The ROM 1310 stores static data and instructions that are needed by the processing unit(s) 1312 and other modules of the electronic system. The permanent storage device 1302, on the other hand, is a read-and-write memory device. This device is a non-volatile memory unit that stores instructions and data even when the electronic system 1300 is off. One or more implementations of the subject disclosure use a mass-storage device (such as a magnetic or optical disk and its corresponding disk drive) as the permanent storage device 1302.

Other implementations use a removable storage device (such as a floppy disk, flash drive, and its corresponding disk drive) as the permanent storage device 1302. Like the permanent storage device 1302, the system memory 1304 is a read-and-write memory device. However, unlike the storage device 1302, the system memory 1304 is a volatile read-and-write memory, such as random access memory. System memory 1304 stores any of the instructions and data that the processing unit(s) 1312 needs at runtime. In one or more implementations, the processes of the subject disclosure are stored in the system memory 1304, permanent storage device 1302, and/or ROM 1310. From these various memory units, the processing unit(s) 1312 retrieves instructions to execute and data to process in order to execute the processes of one or more implementations.

Bus 1308 also connects to input and output device interfaces 1314 and 1306. The input device interface 1314 enables a user to communicate information and select commands to the electronic system. Input devices used with the input device interface 1314 include, for example, alphanumeric keyboards and pointing devices (also called "cursor control devices"). Output device interface 1306 enables, for example, the display of images generated by the electronic system 1300. Output devices used with the output device interface 1306 include, for example, printers and display devices, such as a liquid crystal display (LCD), a light emitting diode (LED) display, an organic light emitting diode (OLED) display, a flexible display, a flat panel display, a solid state display, a projector, or any other device for outputting information. One or more implementations may include devices that function as both input and output devices, such as a touchscreen. In these implementations, feedback provided to the user can be any form of sensory feedback, such as visual feedback, auditory feedback, or tactile feedback; and input from the user can be received in any form, including acoustic, speech, or tactile input.

Finally, as shown in FIG. 13, the bus 1308 also couples the electronic system 1300 to a network (not shown) through the network interface 1316. In this manner, the computer can be a part of a network of computers (such as a local area network ("LAN"), a wide area network ("WAN"), or an Intranet, or a network of networks, such as the Internet. Any or all components of the electronic system 1300 can be used in conjunction with the subject disclosure.

Many of the above-described features and applications may be implemented as software processes that are specified as a set of instructions recorded on a computer readable storage medium (alternatively referred to as computer-readable media, machine-readable media, or machine-readable storage media). When these instructions are executed by one or more processing unit(s) (e.g., one or more processors, cores of processors, or other processing units), they cause the processing unit(s) to perform the actions indicated in the instructions. Examples of computer readable media include, but are not limited to, RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, etc.), magnetic and/or solid state hard drives, ultra density optical discs, any other optical or magnetic media, and floppy disks. In one or more implementations, the computer readable media does not include carrier waves and electronic signals passing wirelessly or over wired connections, or any other ephemeral signals. For example, the computer readable media may be entirely restricted to tangible, physical objects that store information in a form that is readable by a computer. In one or more implementations, the computer readable media is non-transitory computer readable media, computer readable storage media, or non-transitory computer readable storage media.

In one or more implementations, a computer program product (also known as a program, software, software application, script, or code) can be written in any form of programming language, including compiled or interpreted languages, declarative or procedural languages, and it can be deployed in any form, including as a stand alone program or as a module, component, subroutine, object, or other unit suitable for use in a computing environment. A computer program may, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

While the above discussion primarily refers to microprocessor or multi-core processors that execute software, one or more implementations are performed by one or more integrated circuits, such as application specific integrated circuits (ASICs) or field programmable gate arrays (FPGAs). In one or more implementations, such integrated circuits execute instructions that are stored on the circuit itself Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way) all without departing from the scope of the subject technology.

It is understood that any specific order or hierarchy of blocks in the processes disclosed is an illustration of example approaches. Based upon design preferences, it is understood that the specific order or hierarchy of blocks in the processes may be rearranged, or that all illustrated blocks be performed. Any of the blocks may be performed simultaneously. In one or more implementations, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products.

As used in this specification and any claims of this application, the terms "base station", "receiver", "computer", "server", "processor", and "memory" all refer to electronic or other technological devices. These terms exclude people or groups of people. For the purposes of the specification, the terms "display" or "displaying" means displaying on an electronic device.

The predicate words "configured to", "operable to", and "programmed to" do not imply any particular tangible or intangible modification of a subject, but, rather, are intended to be used interchangeably. In one or more implementations, a processor configured to monitor and control an operation or a component may also mean the processor being programmed to monitor and control the operation or the processor being operable to monitor and control the operation. Likewise, a processor configured to execute code can be construed as a processor programmed to execute code or operable to execute code.

A phrase such as "an aspect" does not imply that such aspect is essential to the subject technology or that such aspect applies to all configurations of the subject technology. A disclosure relating to an aspect may apply to all configurations, or one or more configurations. An aspect may provide one or more examples of the disclosure. A phrase such as an "aspect" may refer to one or more aspects and vice versa. A phrase such as an "implementation" does not imply that such implementation is essential to the subject technology or that such implementation applies to all configurations of the subject technology. A disclosure relating to an implementation may apply to all implementations, or one or more implementations. An implementation may provide one or more examples of the disclosure. A phrase such an "implementation" may refer to one or more implementations and vice versa. A phrase such as a "configuration" does not imply that such configuration is essential to the subject technology or that such configuration applies to all configurations of the subject technology. A disclosure relating to a configuration may apply to all configurations, or one or more configurations. A configuration may provide one or more examples of the disclosure. A phrase such as a "configuration" may refer to one or more configurations and vice versa.

Any implementation described herein as an "example" is not necessarily to be construed as preferred or advantageous over other implementations. Furthermore, to the extent that the term "include," "have," or the like is used in the description or the claims, such term is intended to be inclusive in a manner similar to the term "comprise" as "comprise" is interpreted when employed as a transitional word in a claim.

All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. §112, sixth paragraph, unless the element is expressly recited using the phrase "means for" or, in the case of a method claim, the element is recited using the phrase "step for."

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but are to be accorded the full scope consistent with the language claims, wherein reference to an element in the singular is not intended to mean "one and only one" unless specifically so stated, but rather "one or more." Unless specifically stated otherwise, the term "some" refers to one or more. Pronouns in the masculine (e.g., his) include the feminine and neuter gender (e.g., her and its) and vice versa. Headings and subheadings, if any, are used for convenience only and do not limit the subject disclosure.

What is claimed is:

1. An integrated circuit using fin-based cells of a standard cell library, the integrated circuit comprising:
   a plurality of cell rows of different track heights having standard cells of a same track height for each cell row, each of the standard cells comprising:
      a plurality of sub-cell rows with sub-cells of one or more types, wherein the sub-cells are interchangeable with one another to modify a device characteristic of the standard cell; and
   a plurality of power rails configured to supply power to the standard cells, wherein the plurality of cell rows are located between the plurality of power rails.

2. The integrated circuit of claim 1, wherein each of the standard cells is composed of active sub-cells and non-active sub-cells.

3. The integrated circuit of claim 2, wherein the sub-cells have a sub-cell interchanged from an non-active sub-cell to an active sub-cell in order to increase a drive strength characteristic of the standard cell.

4. The integrated circuit of claim 3, wherein the active sub-cells comprise a first type of active sub-cells and a second type of active sub-cells.

5. The integrated circuit of claim 4, wherein the first type of active sub-cells is a p-type transistor and the second type of active sub-cells is an n-type transistor.

6. The integrated circuit of claim 4, wherein the first type of active sub-cells are assigned to a first region of the standard cell and the second type of active sub-cells are assigned to a second region of the standard cell.

7. The integrated circuit of claim 2, wherein the non-active sub-cells provide null functionality in one or more sections of the standard cell.

8. The integrated circuit of claim 1, wherein the sub-cells are interconnected with metal connectors that electrically couple to a semiconductor fin of each sub-cell.

9. The integrated circuit of claim 8, wherein the metal connectors include a horizontal connector that electrically couples a source node to a drain node of a same transistor.

10. The integrated circuit of claim 8, wherein the metal connectors include a vertical connector that electrically couples source nodes or drain nodes of two or more consecutive semiconductor fins in a standard cell.

11. An integrated circuit using fin-based cells of a standard cell library, the integrated circuit comprising:
    a plurality of cell rows, at least one of the plurality of cell rows comprising standard cells of a same track height, wherein at least one of the standard cells comprises:
       a plurality of sub-cell rows, at least one of the plurality of sub-cell rows comprising sub-cells, wherein:
          at least one of the sub-cells has geometric regularity with at least one adjacent sub-cell of the sub-cells, and
          a characteristic of the at least one of the standard cells is imparted by an arrangement of the sub-cells of the at least one of the plurality of sub-cell rows; and
    a plurality of power rails configured to supply power to the standard cells, wherein the at least one of the plurality of cell rows is between two power rails of the plurality of power rails.

12. The integrated circuit of claim 11, wherein:
    the at least one of the sub-cells is of a certain type and is configured to be substitutable with another of the sub-cells of a same type or a different type, and
    the type of the at least one of the sub-cells is a non-active sub-cell type or an active sub-cell type.

13. The integrated circuit of claim 12, wherein:
    the active sub-cell type comprises at least a first type and a second type,
       the first type of the active sub-cell type comprising a p-type transistor, and
       the second type of the active sub-cell type comprising an n-type transistor.

14. The integrated circuit of claim 12, wherein the active sub-cell type comprises at least a portion of a semiconductor fin.

15. The integrated circuit of claim 11, wherein:
the at least one of the plurality of sub-cell rows of the at least one of the standard cells exclusively comprises non-active sub-cells,
the at least one of the plurality of sub-cell rows is configured to be removable, and
the at least one of the standard cells is configured to be movable to another of the plurality of cell rows.

16. The integrated circuit of claim 15, wherein the at least one of the standard cells is configured to be movable from the at least one of the plurality of cell rows to the another of the plurality of cell rows based at least on a change to the same track height of the at least one of the standard cells.

17. An integrated circuit using fin-based cells of a standard cell library, the integrated circuit comprising:
a plurality of power rails configured to supply power; and
a plurality of cell rows, at least one of the plurality of cell rows comprising standard cells of a same track height, wherein at least one of the standard cells is configured to receive power from at least one of the power rails, wherein the at least one of the standard cells comprises:
a plurality of sub-cell rows, at least one of the plurality of sub-cell rows having sub-cells, at least one of the sub-cells having geometric regularity with at least one adjacent sub-cell of the sub-cells, and the at least one of the sub-cells being an active sub-cell or a non-active sub-cell.

18. The integrated circuit of claim 17, wherein:
the at least one of the sub-cells is the non-active sub-cell and the at least one adjacent sub-cell of the sub-cells is the active sub-cell,
the active sub-cell is one of a first type or a second type, and
the non-active sub-cell is configured to be substitutable with another non-active sub-cell and is also configured to be substitutable with another active sub-cell of a same type as the active sub-cell.

19. The integrated circuit of claim 17, wherein the at least one of the sub-cells is the non-active sub-cell and is configured to be substitutable with the active sub-cell to increase a drive strength characteristic of the standard cell.

20. The integrated circuit of claim 17, wherein at least two cell rows of the plurality of cell rows have different track heights.

* * * * *